United States Patent [19]

Tanaka et al.

[11] Patent Number: 4,891,661

[45] Date of Patent: Jan. 2, 1990

[54] COLOR IMAGE COPYING DEVICE

[75] Inventors: Hironori Tanaka, Nara; Matahira Kotani, Ikoma; Masafumi Matsumoto, Takaichi, Japan

[73] Assignee: Sharp Kabushiki Kaisha, Osaka, Japan

[21] Appl. No.: 164,337

[22] Filed: Mar. 4, 1988

[30] Foreign Application Priority Data

| Mar. 5, 1987 | [JP] | Japan | 62-51752 |
| Mar. 5, 1987 | [JP] | Japan | 62-51753 |
| Mar. 5, 1987 | [JP] | Japan | 62-51754 |
| Mar. 5, 1987 | [JP] | Japan | 62-51755 |

[51] Int. Cl.⁴ .................. G03B 27/32; G03B 27/52
[52] U.S. Cl. .................................. 355/27; 355/32
[58] Field of Search ............... 355/27, 29, 32, 35, 355/107, 72; 430/138, 211, 235, 962; 354/297, 301-304, 319; 250/327.2

[56] References Cited

U.S. PATENT DOCUMENTS

| 4,624,560 | 11/1986 | Beery | 355/27 |
| 4,714,943 | 12/1987 | Sakakibara et al. | 355/27 |
| 4,740,809 | 4/1988 | Yamamoto et al. | 355/27 |
| 4,742,374 | 5/1988 | Yamamoto et al. | 355/27 |
| 4,748,475 | 5/1988 | Ishiyama et al. | 355/32 X |
| 4,777,513 | 10/1988 | Nelson | 355/27 |
| 4,785,332 | 11/1988 | Nagumo et al. | 355/27 |

FOREIGN PATENT DOCUMENTS 5930573 1/1982 Japan.

Primary Examiner—Michael A. Wintercorn
Attorney, Agent, or Firm—Birch, Stewart, Kolasch & Birch

[57] ABSTRACT

A color copier including an exposure light source exposes an original document with red, blue, and green light, on a photosensitive film having a substrate and an ink coating which includes ink particles of multiple colors carried on the substrate, and on which a reproduction of the original document is formed, in response to the light exposure, through a reaction of ink particles of the color which corresponds to the wavelength of the light reflected from the original document. The color copier further includes a lightproof film case for storing the photosensitive film; an image forming lens for forming an image of the original document on the photosensitive film by focusing the reflected light; a copy paper feeder for feeding a copy paper; a fixer for fixing the image formed on the photosensitive film on the copy paper; a separation claw which separates the photosensitive film from the copy paper after the fixing of the image; and a film take-up shaft for winding thereon the photosensitive film. The film take-up shaft is located downstream from the separation claw in the direction of paper transport, and is formed with an insertion slot for inserting a leading edge of the photosensitive film.

4 Claims, 16 Drawing Sheets

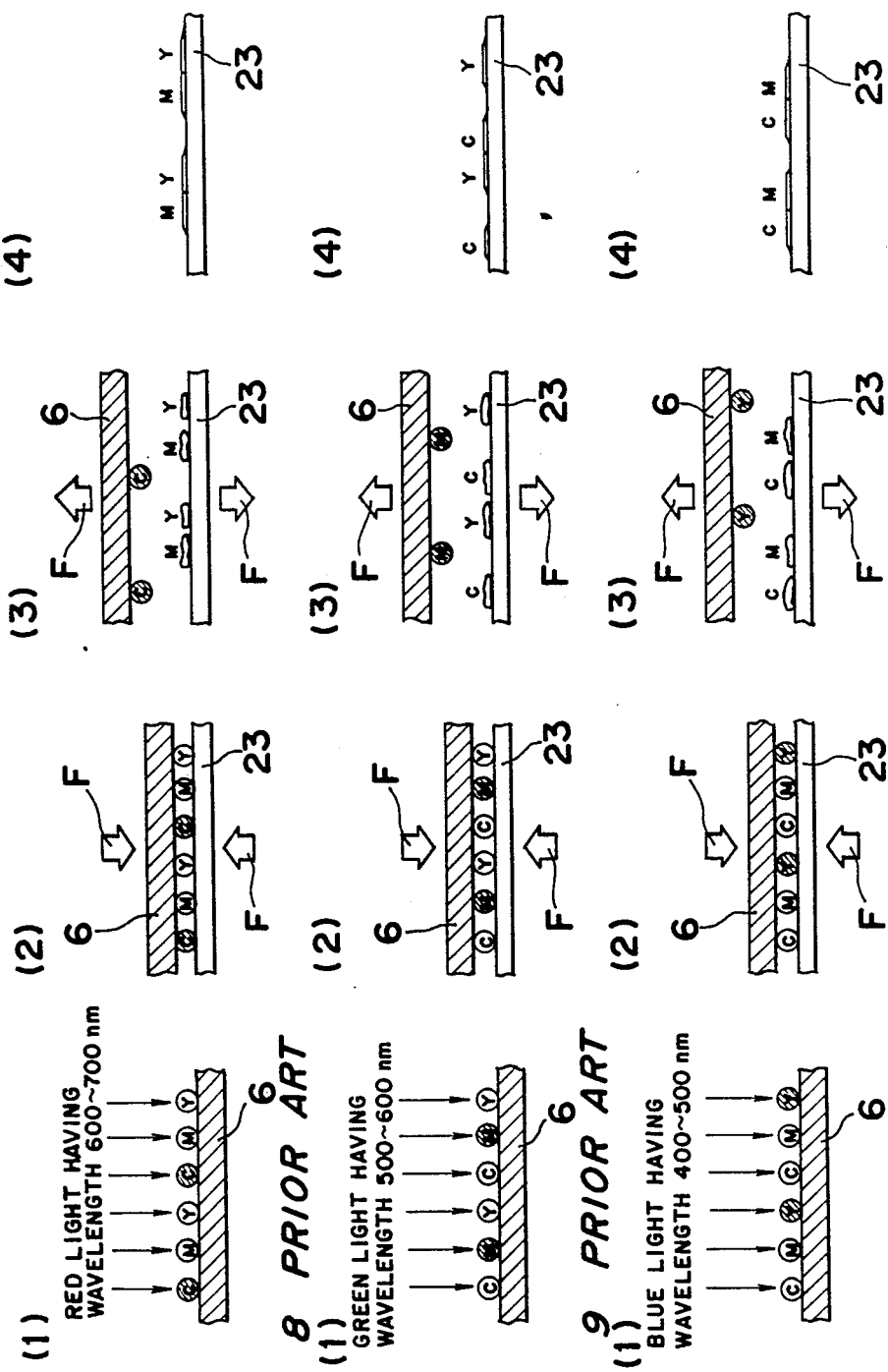

Fig. 14
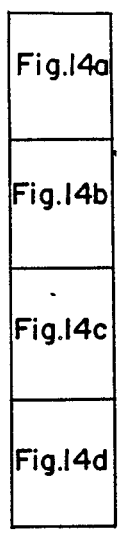
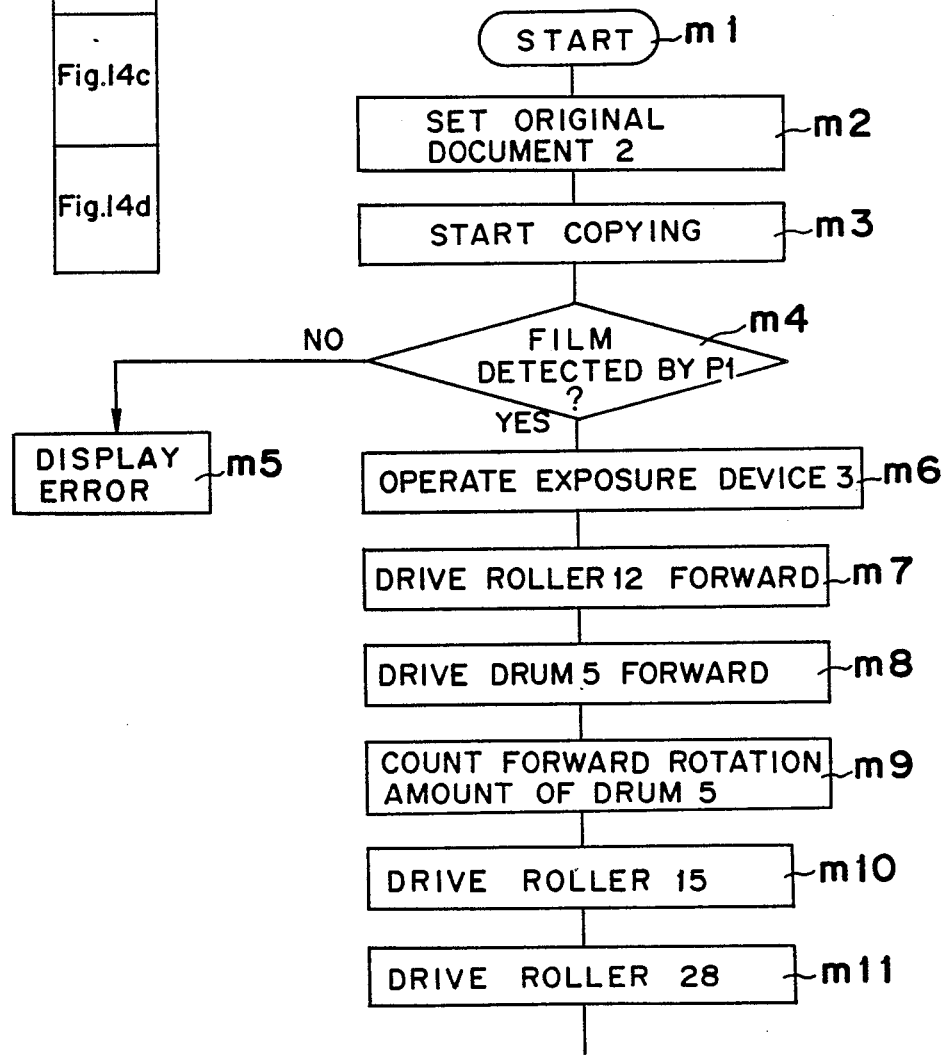
Fig. 14a

COLOR IMAGE COPYING DEVICE

BACKGROUND OF THE INVENTIONS

1. Field of the Invention

The present invention relates to a new color image copying device concerned with an optical means of reading and reproducing color images such as a color copier, and in particular which is able to read and reproduce color images with a single scanning operation without requiring a charge-coupled device imaging sensor or other imaging device.

2. Description of the Prior Art

As disclosed, for example, in Japanese Patent Laid-Open Publication No. 55-162174, conventional devices for reading and reproducing color images sequentially illuminate the color document original with light having differing red, green, and blue spectral characteristics. This light is reflected from the aforementioned color document, passes a mirror and lens, and is read into a charge-coupled device imaging sensor. The red, blue, and green reflected light is read sequentially, synchronized to the emissions timing of the aforementioned red, blue, and green lights, to obtain the corresponding red, blue, and green imaging information. This red, blue, and green imaging information is color converted to produce yellow, magenta, cyan, and black color imaging information, and a color image is reproduced by transferring yellow, magenta, cyan, and black inks to the copy paper by a thermal transfer or other reproduction means.

However, in the previously described color image copying device, an emissions timing control device for red, blue, and green light sources which generate the red, blue, and green exposure light, a charge-coupled device imaging sensor and charge extraction timing control device, a color conversion processor, a thermal transfer recording device, and yellow, magenta, cyan, and black ink ribbons are required, necessarily resulting in a complex design, large size, and high cost.

SUMMARY OF THE INVENTION

The objective of the present invention is a color image copying device which resolves the aforementioned technical problems, eliminates the need for multiple light sources, enables reading and reproduction of color images with a simplified construction in which a charge-coupled device imaging sensor is not required, and which, moreover, is able to automatically load a photosensitive film into a take-up shaft in a manner so as to prevent exposure of said photosensitive film before reading of the color image.

A color image copying device according to the present invention comprises: exposure means for exposing an original document with red, blue, and green light; a photosensitive film having a substrate and an ink coating which includes ink particles of multiple colors carried on said substrate, and on which a reproduction of the original document is formed, in response to the light exposure, through a reaction of ink particles of the color which corresponds to the wavelength of the light reflected from the original document; film case means for storing said photosensitive film, said film case means being made of a lightproof material; image forming means for forming an image of said original document on said photosensitive film by focusing the reflected light; copy paper feeding means for feeding a copy paper; fixing means for fixing the image formed on said photosensitive film on said copy paper; separation means which separates said photosensitive film from said copy paper after the fixing of said image; a film take-up shaft for winding thereon said photosensitive film, said film take-up shaft being located downstream from said separation means in the direction of paper transport, and being formed with an insertion slot for inserting a leading edge of said photosensitive film; take-up shaft driving means for driving said take-up shaft to take-up said film after insertion in said slot of the leading edge of said film; detection means for detecting the leading edge of the photosensitive film at a position between said separation means and said take-up shaft; and control means for controlling said take-up shaft drive means to rotate after a predetermined time which is sufficient for the leading edge of the film being inserted in said insertion slot after said film detection means detects said leading edge of the film.

By the above arrangement of the present invention, the image reading and reproduction can be accomplished by a single scan over the original document, and therefore, the copying speed can be improved.

Also, since the film case is made of a lightproof material, the film can be prevented from being exposed by light intruding from the light source.

Also, since the take-up shaft starts to rotate after a predetermined time from the detection of the leading edge of the photosensitive film, the leading edge portion of the film can be properly inserted into an insertion slot formed in the shaft before the shaft starts to rotate.

Further provided, according to the present invention, is a pair of guide members which conduct the photosensitive film separated from the copy paper by the separation means into the aforementioned take-up shaft, said guide members contacting in a pressure applied manner the outer surface of the photosensitive film being wound onto the take-up shaft, and which are mutually juxtaposed and displaced in accordance with changes in the diameter of the aforementioned take-up roll.

Thus, by the above arrangement, the photosensitive film separated from the copy paper by the separation means passes between a pair of guide members, is conducted into a take-up shaft, and is taken up. The guide members contact the outer surface of the photosensitive film being wound onto the take-up shaft in a pressure applied manner, and moreover are mutually juxtaposed and displaced in accordance with changes in the diameter of the aforementioned take-up roll. Therefore, because a pressure is constantly applied by said guide members to the roll of photosensitive film being wound onto the take-up shaft, said photosensitive film is wound evenly onto said take-up shaft.

Further provided, according to the present invention, is a means of driving the film case backwards.

Thus, by this arrangement, when transfer of the first page of a color image is completed, the last exposed portion of the photosensitive film is transported from the exposure position to the fixing position. The transportation from the exposure position to the fixing position is comparatively long. Thus, if copying of a second document page begins from this position without rewinding the aforementioned photosensitive film after copying of the first page of the original document, that portion of the photosensitive film between the exposure position to the fixing position will be wasted. Thus, in this case the film case is driven backward to rewind the unused portion of the photosensitive film to the exposure position. Thus, the photosensitive film can be used more effectively.

Further provided, according to the present invention, are ejection rollers which eject the separated copy paper separated from the photosensitive film by the separation means, and which may also act as heat fusing rollers by means of heating elements built in to the ejection rollers Thus, by this arrangement, the ejection rollers which eject the copy paper are constructed in such a manner as to be able also function as heat fusing rollers, and when said ejection rollers are used as heat fusing rollers by means of, in one preferred embodiment of the present invention, a selection means, heat fusing of the copy paper occurs when said copy paper passes between said ejection rollers, imparting a glossy finish to the copied image formed on said copy paper. Furthermore, when normal ejection roller operation is selected by said selection means, imparting of said glossy finish does not occur, and the copy paper is simply ejected.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 7 through 9 illustrate diagrams showing the basic operating principle of photosensitive film in color image copier unit of FIG. 1;

FIG. 14 and FIGS. 14a–14d is a flow chart showing operations of the initial copy processing procedure;

DETAILED DESCRIPTION OF THE INVENTION

Figure 1:
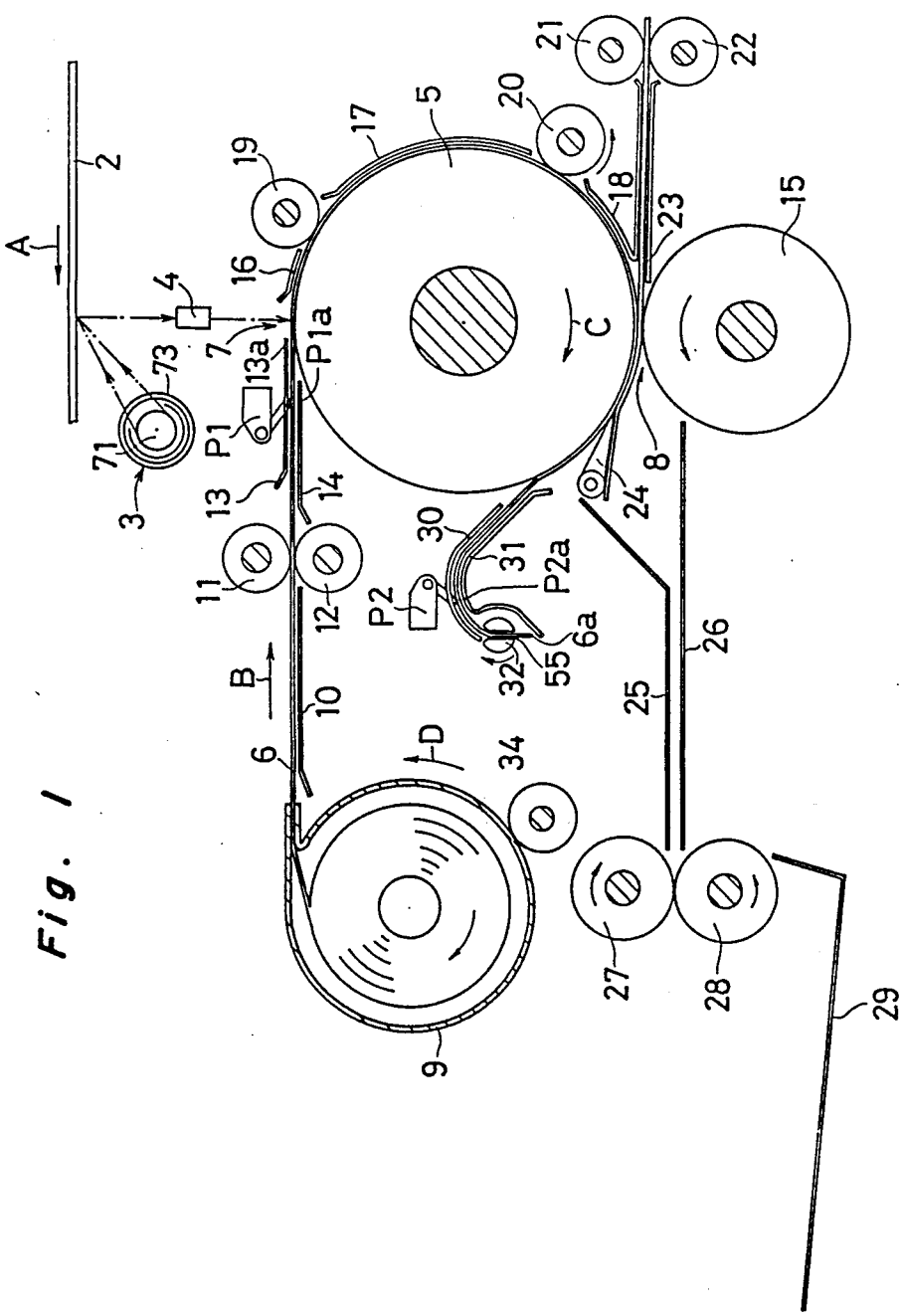
FIG. 1 is a cross sectional view of the overall construction of a first embodiment of a color image copier unit according to the present invention.

Referring to FIG. 1, a diagram in cross section of the overall construction of a first embodiment of a color image copier unit 1 according to the present invention is shown. Original document 2 which is to be copied is transported intermittently in the direction of arrow A by a pulse motor or other drive means. Exposure device 3 which illuminates original document 2 with red, blue, and green light is provided below original document 2. This exposure device 3 has a rotating filter 73 including red, blue, and green light zones, so that red, blue, and green lights are successively emitted as rotating filter 73 turns. The red, blue, and green light emitted from exposure device 3 illuminate original document 2. The reflected light is focused by lens 4, and the image of the original is formed on photosensitive film 6 transported along the outer surface of drum 5. Drum 5 also functions as a fixing roller, maintains photosensitive film 6 at exposure position 7, and also functions to transport the exposed photosensitive film 6 to fixing position 8. Photosensitive film 6 is stored in a roll in film case 9. When photosensitive film 6 is fed from film case 9, it is guided by guide member 10, delivered in transportation direction B by paired transport rollers 11 and 12, passes between paired guide members 13 and 14, and is supplied to the outer surface of drum 5. A detector P1 which functions to detect the leading edge of photosensitive film 6 is positioned slightly upstream in transportation direction B relative to exposure position 7 on drum 5.

Guide members 16, 17, 18, and transport rollers 19 and 20 are provided along the circumference of drum 5. Photosensitive film 6 is exposed at exposure position 7, and transported to fixing position 8 by the rotational drive power of transport rollers 19, 20 and drum 5 along guide members 16, 17, 18 in the direction of arrow C. Main fixing roller 15, which can be variably displaced to contact or release drum 5, is positioned at fixing position 8. Drum 5 and main fixing roller 15 are coordinated to press together photosensitive film 6 and copy paper 23, thereby causing the ink particles coating the surface of photosensitive film 6 to burst and be transferred to copy paper 23 as will be discussed later.

Downstream from fixing position 8 in the direction of rotation C of drum 5, a separation claw 24 is provided to separate copy paper 23 and photosensitive film 6. This separation claw 24 forcibly separates photosensitive film 6 and copy paper 23, which have been pressed together at fixing position 8. Separated copy paper 23 passes guide members 25 and 26, and is ejected to tray 29 by paired ejection rollers 27 and 28. Note that ejection rollers 27 and 28 may also include a heater K, so that rollers 27 and 28 and may also function as heat fusing rollers.

Photosensitive film 6 separated by separation claw 24 passes guide members 30 and 31, and is taken up by film take-up shaft 32. A detector P2 which functions to detect leading edge 6a of photosensitive film 6 in order to thread leading edge 6a of photosensitive film 6 in film take-up shaft 32 is positioned in the transportation path between separation claw 24 and film take-up shaft 32. Also, photosensitive film rewind roller 34 which drives film case 9 in the direction of arrow D is also provided for use in conjunction with film case 9. Transport rollers 11, 19, 20, 21, and 27 are slave rollers, and transport rollers 12, 15, 22, and 28 are drive rollers.

Figure 2:
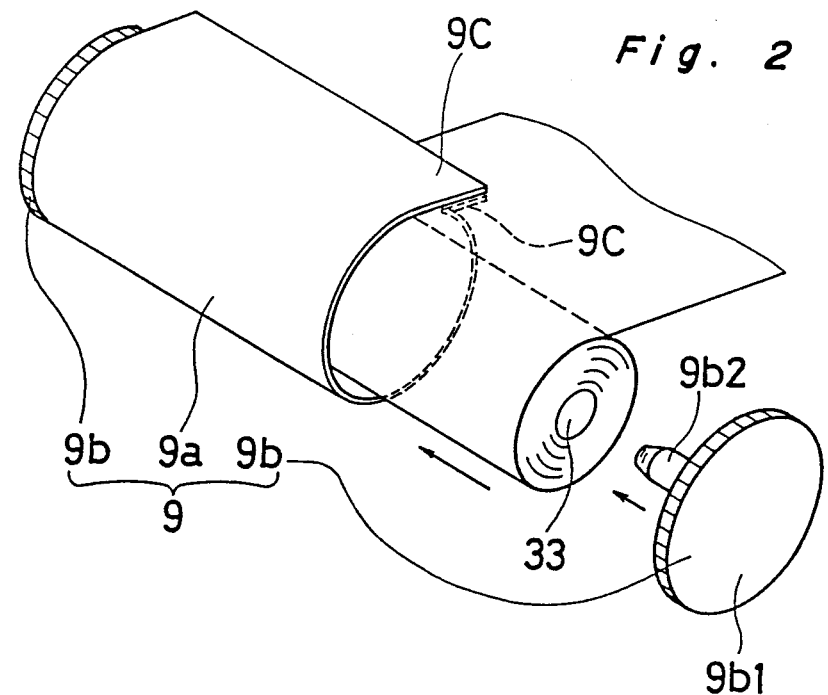
FIG. 2 is a detailed perspective view of a film case employed in the embodiment shown in FIG. 1.

Referring to FIG. 2, a detailed perspective view of the film case 9 assembly is shown. Film case 9 is made of a lightproof material, and consists primarily of a cylindrical film case body 9a, and covers 9b which can be freely attached to and removed from cylindrical film case body 9a to cover the open ends of film case 9. On cylindrical film case body 9a are formed a pair of guides 9c which are used to guide photosensitive film 6. Also, covers 9b consist of a disc-shaped body 9b1, and a spindle 9b2 which projects from the inside face of body 9b1. To store photosensitive film 6 in film case 9, the wound roll of photosensitive film 6 is in cylindrical film case body 9a, and covers 9b are fitted on the ends of cylindrical film case body 9a so that spindles 9b2 fit into core 33 of the rolled photosensitive film 6. Because photosensitive film 6 is thus loaded in film case 9, and film case 9 is as previously mentioned made of a lightproof material, exposure of photosensitive film 6 by ambient light is prevented. Reproduction of unclear images on copy paper 23 caused by the exposure of photosensitive film 6 before it is exposed at exposure position 7 is thereby prevented.

Figure 3:
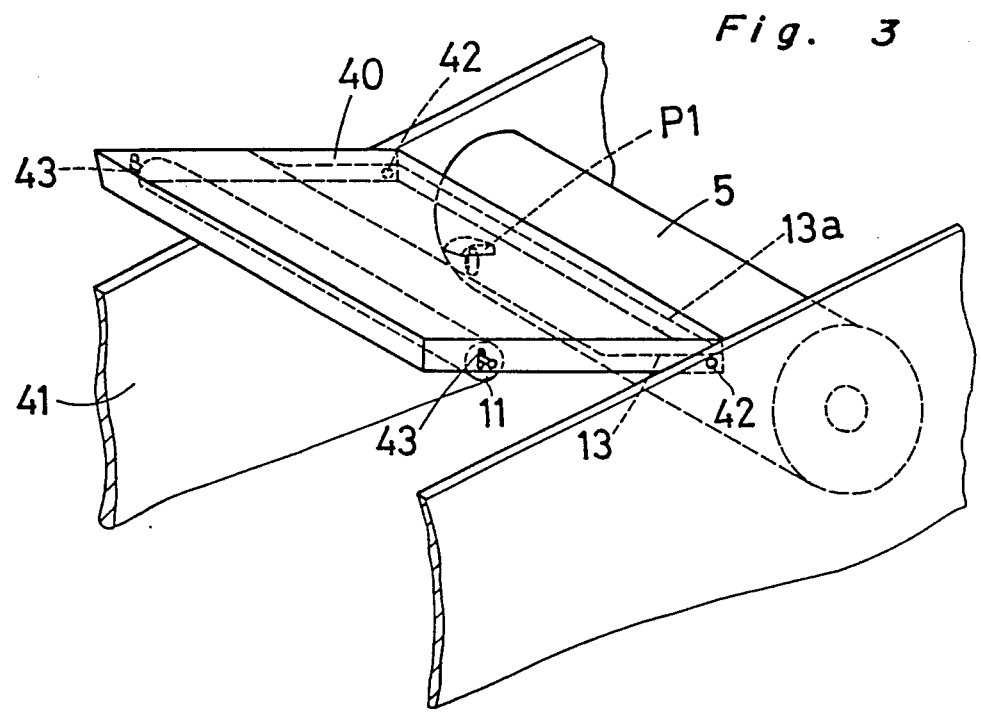
FIG. 3 is a detailed perspective view of the area around a cover portion of the embodiment shown in FIG. 1.
Figure 4:
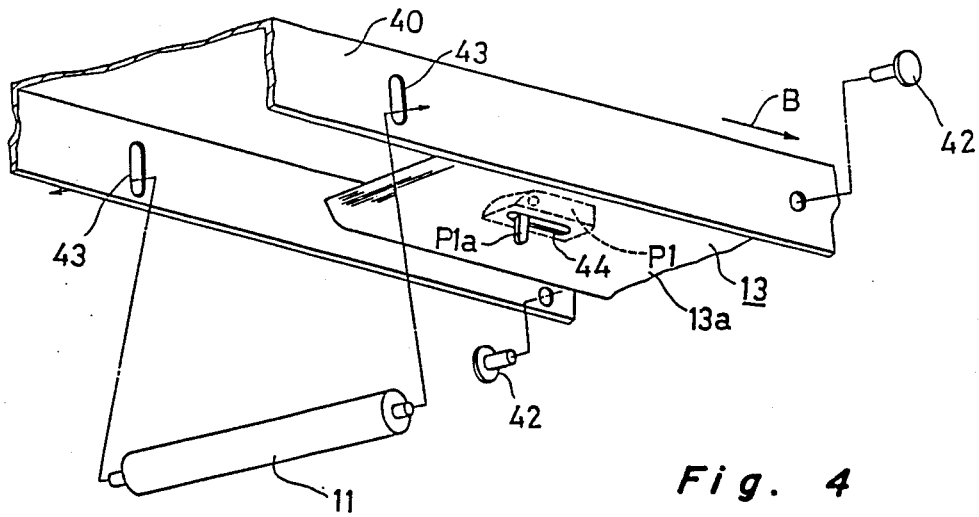
FIG. 4 is an perspective view from below the cover portion of the embodiment of FIG. 1.

Referring now to FIGS. 3 and 4, a detailed perspective view of the area around cover 40, and a perspective view from below cover 40 are shown, respectively. A cover 40 is mounted by pins 42 to side wall 41 of the frame of color image copier unit 1. On both sides of this cover 40 are guide holes 43 running up and down with respect the face of cover 40, and these guide holes 43 are fitted into the rotating shaft of transport roller 11. Therefore, when cover 40 is closed and in a horizontal position, transport roller 11 is pressed of its own weight against transport roller 12.

Guide member 13 has an oval hole 44 extending in the direction of transportation direction B, and actuator P1a of detector P1 positioned behind this guide member 13 passes through oval hole 44. Thus, when cover 40 is closed to obtain horizontal position, actuator P1a protrudes into the transport path of photosensitive film 6 so that leading edge 6a of photosensitive film 6 presses against this actuator P1a, thereby enabling detector P1 to detect the insertion of leading edge 6a of photosensitive film 6.

Moreover, when cover 40 is open, edge 13a of guide member 13 is juxtaposed to the outside surface of drum 5 immediately upstream of exposure position 7, and the transportation path of photosensitive film 6 is thereby closed.

Figure 5:
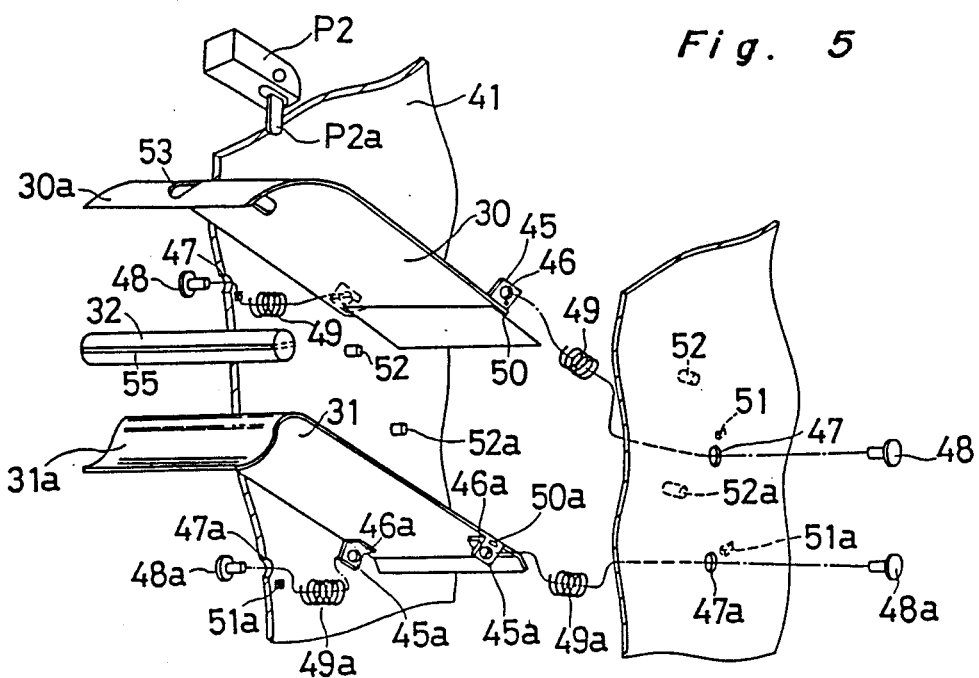
FIG. 5 is an exploded perspective view of the area around guide members shown in FIG. 1.

Referring to FIG. 5 an exploded perspective view of the area around guide members 30 and 31 is shown. A flange 45 is provided at the end of guide member 30 on the side to drum 5. A spindle hole 46 is formed in this flange 45. In side wall 41 of the frame, holes 47 are formed, and pins 48 are passed through holes 47, coil springs 49, and holes 46. Thus, guide member 30 is able to pivot around pins 48. Furthermore, one end of each coil spring 49 is held by a hook 50 on flange 45, and the other end of each coil spring 49 is held by a hook 51 formed on the inner surface of side wall 41 of the frame. Thus, guide member 30 is pulled towards guide member 31 by the tension of coil springs 49. It is to be noted that stoppers 52 are provided on the inner face of side wall 41 of the frame to constrain the displacement of guide member 30.

Guide member 31 has the same construction as guide member 30, and corresponding parts are suffixed with an "a." With this construction, guide member 31 can pivot around pin 48a, and is pressed towards guide member 30 by the force of coil springs 49a. Also, stoppers 52 constrain the displacement of guide member 30.

Furthermore, hole 53 is formed in the aforementioned guide member 30 parallel to the length of the member. Actuator P2a of detector P2 extends through this hole, and the tip of said actuator P2a projects into the photosensitive film 6 transportation path defined by guide members 30 and 31. Therefore, when photosensitive film 6 passes between guide members 30 and 31, leading edge 6a presses and trips actuator P2a, enabling detector P2 to detect that the leading edge of photosensitive film 6 has passed.

In film take-up shaft 32 located at the end of guide members 30 and 31 opposite drum 5 is formed a photosensitive film take-up slot 55 parallel to the length of film take-up shaft 32 and slightly longer than the width of photosensitive film 6. As will be discussed later, leading edge 6a of photosensitive film 6 is fitted into this take-up slot 55, and when film take-up shaft 32 is driven with the film inserted in take-up slot 55, the used photosensitive film 6 is wound onto film take-up shaft 32. Furthermore, when photosensitive film 6 is wound onto film take-up shaft 32, ends 30a and 31a of guide members 30 and 31 press against surface 6b (see FIG. 15) of photosensitive film 6. Thus, a predetermined contact pressure is maintained on photosensitive film 6, thereby preventing the film from being carried diagonally and wound unevenly on the shaft, and thus assuring a constantly even roll.

Figure 6:
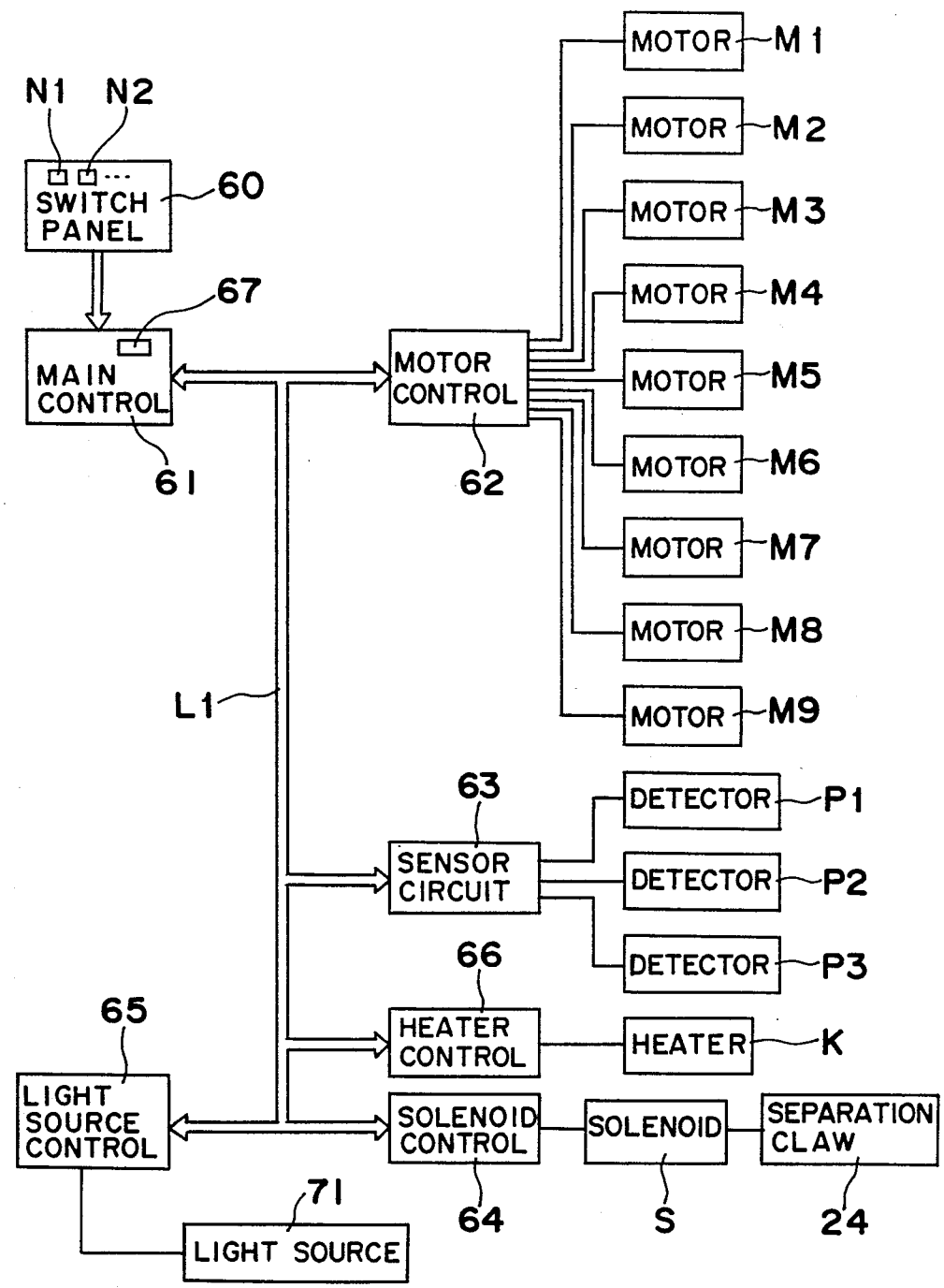
FIG. 6 is a block diagram showing the electrical construction of color image copier unit of FIG. 1.

Referring next to FIG. 6 a block diagram showing the electrical construction of color image copier unit 1 is shown. An operation signal from switch panel 60 is applied to main control 61. Motor control 62, sensor circuit 63, solenoid control 64, light source control 65, and heater control 66 are connected separately to main control 61 via bus line L1.

Motor control 62 controls motors M1 through M9. These motors M1 through M9 may be pulse motors. Motor M1 is the transport motor for original document 2, and motor M2 is the drive motor for rotating filter 73 provided with exposure device 3. Motor M3 is the drive motor for drum 5; motor M4 is the drive motor for supply roller 22 for the aforementioned copy paper; motor M5 is the drive motor for transport roller 12; motor M6 is the drive motor for film take-up shaft 32; motor M7 is the drive motor for photosensitive film rewind roller 34; motor M8 is the drive motor for ejection roller 28; and motor M9 is the drive motor for main fixing roller 15.

Detectors P1, P2, and P3 provided with exposure device 3 are separately connected to sensor circuit 63. Detector P3 detects a single revolution of rotating filter 73 provided with exposure device 3. Solenoid S which opens and closes separation claw 24 is connected to solenoid control 64. Light source control 65 controls light source 71 and other light sources provided with exposure device 3. Furthermore, heater control 66 controls heating of heater K.

In FIGS. 7 through 9 there is illustrated the basic operating principle of the photosensitive film 6 in the color image copier unit 1 of the present invention.

In FIG. 7 discloses what happens when light having a wavelength of 600 nm to 700 nm, i.e., red light, illuminates photosensitive film 6.

Photosensitive film 6 is coated with yellow, magenta, and cyan ink particles which are separately hardened by light of differing wavelengths (specifically, red light having a 600 nm to 700 nm wavelength hardens cyan ink particles, green light having a 500 nm to 600 nm wavelength hardens magenta ink particles, and blue light having a 400 nm to 500 nm wavelength hardens yellow ink particles). If, for example, the film is illuminated with red light having a 600 nm to 700 nm wavelength light component, cyan ink particles are hardened as shown in FIG. 7 (1). At this time, by setting copy paper 23 against photosensitive film 6 and applying pressure F of approximately 350 kg/cm² from the outside of both copy paper 23 and photosensitive film 6 as shown in FIG. 7 (2), soft magenta and yellow ink particles, which were not hardened by the aforementioned red light illumination, burst and are transferred to copy paper 23 as shown in FIG. 7 (3). Thus, illumination with red light results in copying of magenta and yellow, colors which contain a red component, on copy paper 23. Once the ink particles are transferred, copy paper 23 is carried through ejection rollers 27 and 28, which are also heat fusing rollers, the ink is fused, and a gloss is imparted as shown in FIG. 7 (4).

In FIG. 8 there is shown the same situation when the aforementioned photosensitive film 6 is illuminated with green light having a 500 nm to 600 nm wavelength light component. The same process described above with red light illumination is repeated as shown in FIGS. 8 (1) through (4). Hardening of magenta ink particles causes cyan and yellow, which have a green color component, to be transferred to copy paper 23, and gloss is imparted to the copied image through fusing.

In FIG. 9 there is illustrated the same situation when the aforementioned photosensitive film 6 is illuminated with blue light having a 400 nm to 500 nm wavelength light component. The same process described above with red and green light illumination is repeated as shown in FIGS. 9 (1) through (4). Hardening of yellow ink particles causes cyan and magenta, which have a blue color component, to be transferred to copy paper 23, and gloss is imparted to the copied image through fusing.

Therefore, when red, blue, and green light is reflected from a given unit area of original document 2 and sequentially illuminate the same unit area of photosensitive film 6, the ink particles coated on the surface of photosensitive film 6 are sequentially hardened, resulting ultimately in copying of a full color image.

The timing of red, blue, and green light emissions from the light source, and the timing of original transportation and drum rotation are next discussed with reference to FIG. 10.

Figure 10:
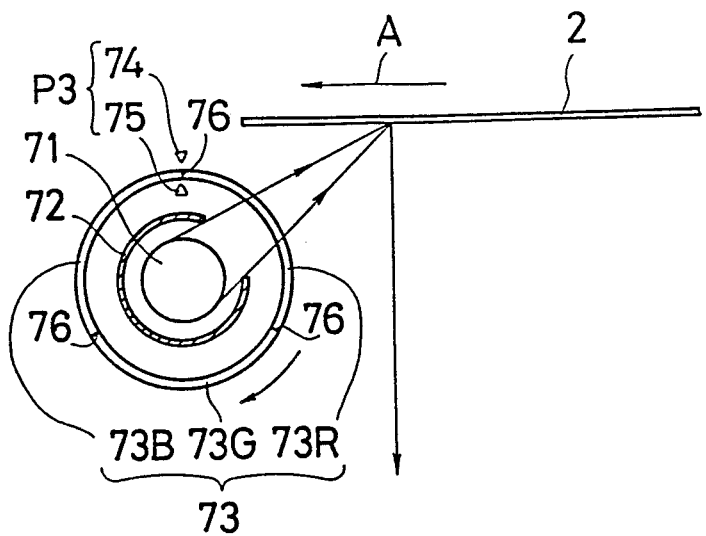
FIG. 10 is a cross sectional view of the specific construction of the exposure device shown in FIG. 1.

Referring now to FIG. 10, the specific construction of exposure device 3 is shown. Reference number 71 is a light source consisting of an electric discharge lamp or similar means of illumination. A shield 72 is provided around light source 71 to contain light from light source 71 and to restrict the light path, and a cylindrically-shaped rotating filter 73 with integrated red, blue, and green components encircles light source 71. P3 is an optical detector which detects a single revolution of the aforementioned rotating filter 73, and consists of light emitter 74 and receptor 75. One revolution of rotating filter 73 can be determined by detecting, for example, a slit 76 provided at the filter edge.

According to the above construction, when copying of a color image begins, light source 71 first turns on, and rotating filter 73 then rotates. Light from light source 71 thereby passes through red rotating filter 73R to illuminate original document 2, and thus reflected light with a red color component passes lens 4, and illuminates photosensitive film 6.

Next, light from light source 71 passes through green rotating filter 73G to illuminate original document 2, and thus reflected light with a green color component passes lens 4, and illuminates photosensitive film 6; light from light source 71 then passes through blue rotating filter 73B to illuminate original document 2, and thus reflected light with a blue color component passes lens 4, and illuminates photosensitive film 6. Thus, original document 2 is illuminated with red, blue, and green light with one full revolution of rotating filter 73. Detector P3 detects one filter rotation when this full revolution is completed.

Synchronized to this detection of one complete rotation of rotating filter 73, original transportation motor M1 operates to carry original document 2 one feed unit and to turn drum 5 a given amount, and the aforementioned operation is then repeated.

Figure 11:
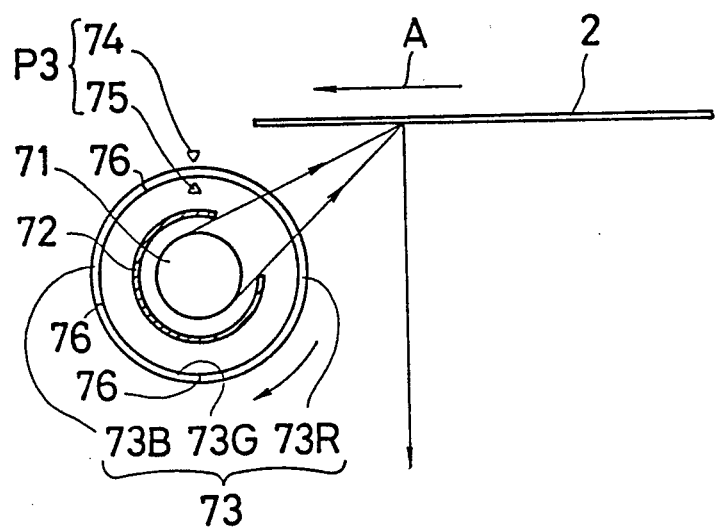
FIG. 11 is a cross sectional diagram of a modification of exposure device of FIG. 10.

It is to be noted that while in the previously described embodiment of the present invention red rotating filter 73R, green rotating filter 73G, and blue rotating filter 73B occupy an equal percentage of total surface area in rotating filter 73, the construction shown in FIG. 11 is preferred due to the characteristics of the respective light components. Specifically, red light has the slowest response time of the red, blue, and green light components, and to compensate for this slow response time, the area of the red rotating filter 73R is preferably and relatively larger than that of the other filters, thus compensating for the sensitivity characteristics of photosensitive film 6.

Figure 12:
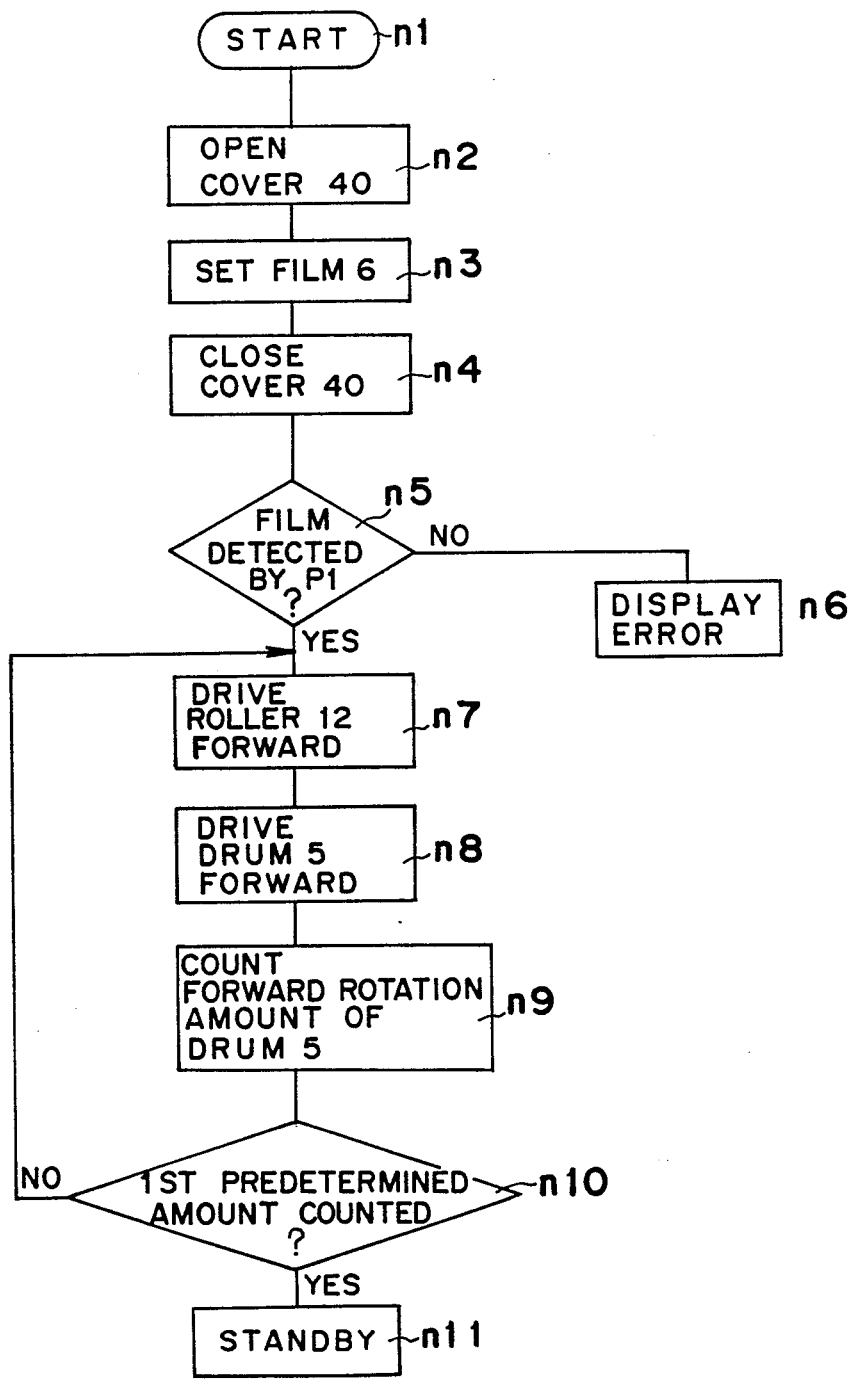
FIG. 12 is a flow chart showing operations performed to set the photosensitive film in color image copier unit of FIG. 1.
Figure 13:
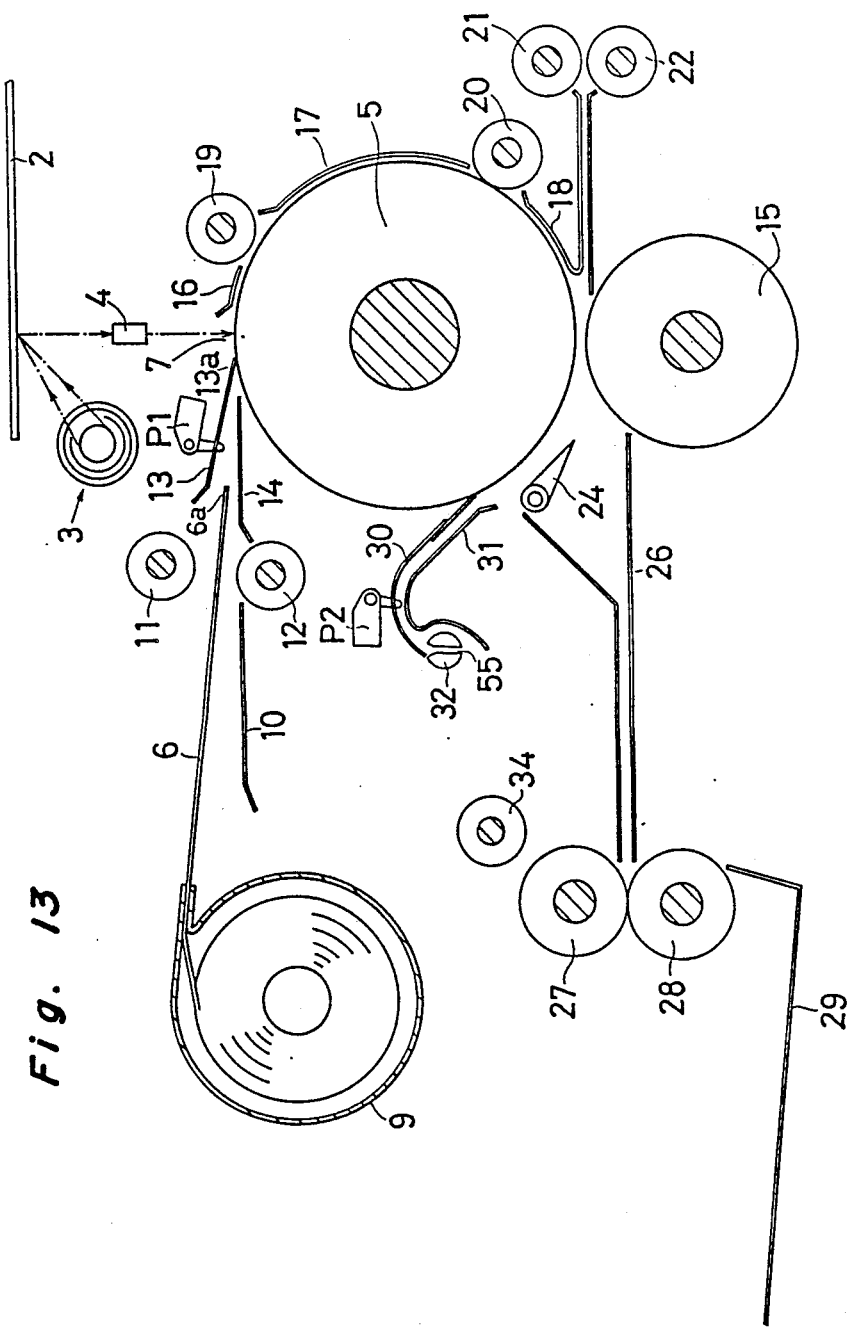
FIG. 13 is a cross sectional view showing the condition in which the film case is loaded in the color image copier unit of FIG. 1.

Referring to FIG. 12, shown is a flow chart showing the sequence of operations performed to set photosensitive film 6 in color image copier unit 1. At the initial stage of this film setting sequence, separation claw 24 is detached from drum 5 as shown in FIG. 13, and rollers 12, 15, 22, 28, and 34 are stopped. Furthermore, main fixing roller 15 is also detached from drum 5. When the sequence advances from step n1 to step n2 from this position, cover 40 opens. As shown in FIG. 13, transport roller 11 is detached from transport roller 12. Furthermore, edge 13a at the drum 5 side of guide member 13 contacts the outer surface of drum 5, covering the transportation path of photosensitive film 6. Furthermore, actuator P1a of detector P1 is extended slightly into the transportation path.

When color image copier unit 1 advances from step n2 to step n3, leading edge 6a of photosensitive film 6 is pulled out from film case 9, passes between paired transport rollers 11 and 12, and is inserted to where edge 13a of guide member 13 contacts drum 5. Because actuator P1a of detector P1 projects only slightly into the transportation path at this time, it does not contact photosensitive film 6. In this position, leading edge 6a of photosensitive film 6 can be accurately positioned to the drum. Also, because transport rollers 11 and 12 are detached at this time, photosensitive film 6 can be easily inserted.

After photosensitive film 6 is set as thus described, cover 40 closes at step n4. At the next step n5, detector P1 determines whether or not photosensitive film 6 was detected. Specifically, when cover 40 closes, actuator P1a of detector P1 contacts the top surface of photosensitive film 6, causing actuator P1a to be displaced as shown in FIG. 1. This displacement enables detector P1 to detect the presence of photosensitive film 6 in the transportation path.

If at step n5 detector P1 does not detect photosensitive film 6, the sequence moves to step n6, and an error is indicated by a light emitting diode or other means.

If photosensitive film 6 is detected at step n5, the sequence advances to step n7, transport roller 12 is driven forward, and at step n8, drum 5 is driven forward. This action causes photosensitive film 6 to be carried along the circumference of drum 5. Furthermore, at step 9, counting of the amount of forward rotation of drum 5 by counter 67 (see FIG. 6) begins with the start of the forward rotation of drum 5. At step 10, the value of counter 67 is evaluated to determine whether the drum has travelled a first predetermined amount. This first predetermined amount is the distance the leading edge 6a of photosensitive film 6 must be carried by drum 5 to reach transport roller 19. If at step n10 the value of counter 67 is not equivalent to the first predetermined amount, the sequence returns to step n7. If at step n10 the first predetermined amount has been counted, then leading edge 6a of photosensitive film 6 has reached transport roller 19, and setting of photosensitive film 6 is completed. Thus, color image copier unit 1 enters the standby mode at step n11. This thereby completes the photosensitive film 6 setting sequence.

Figure 14B:
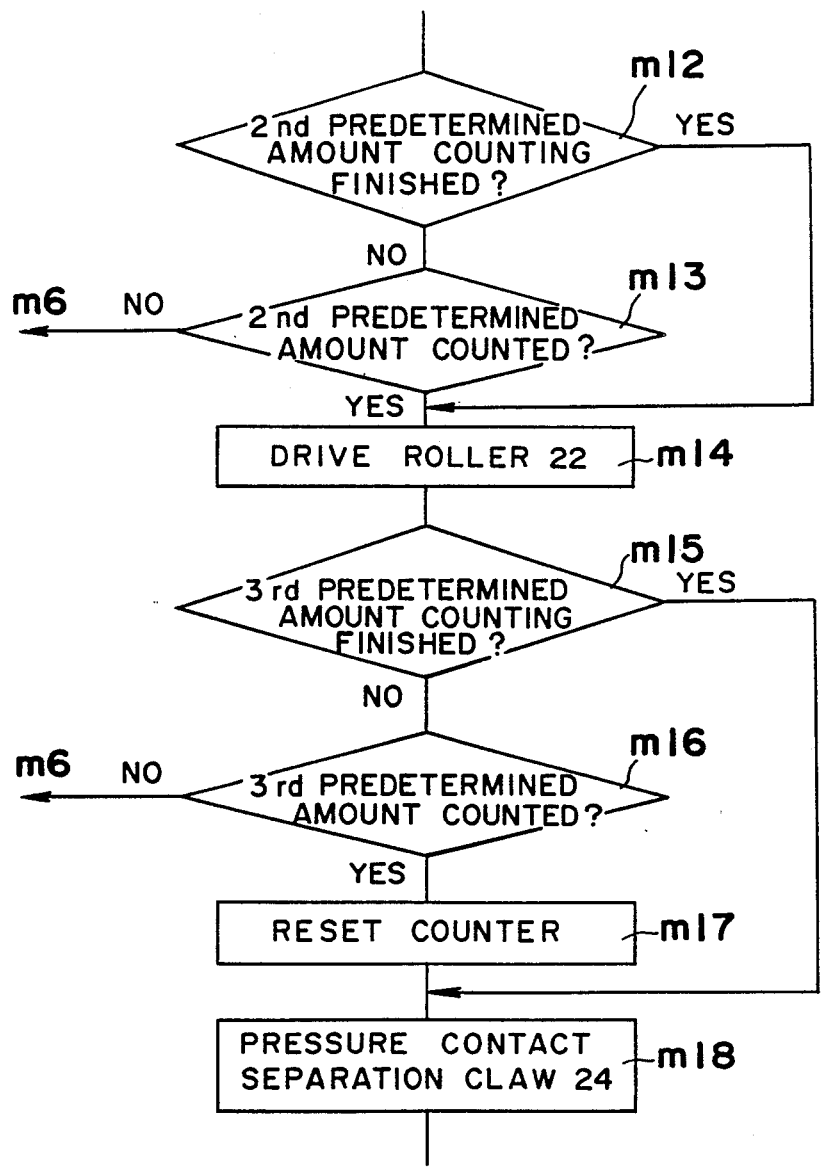
Figure 14C:
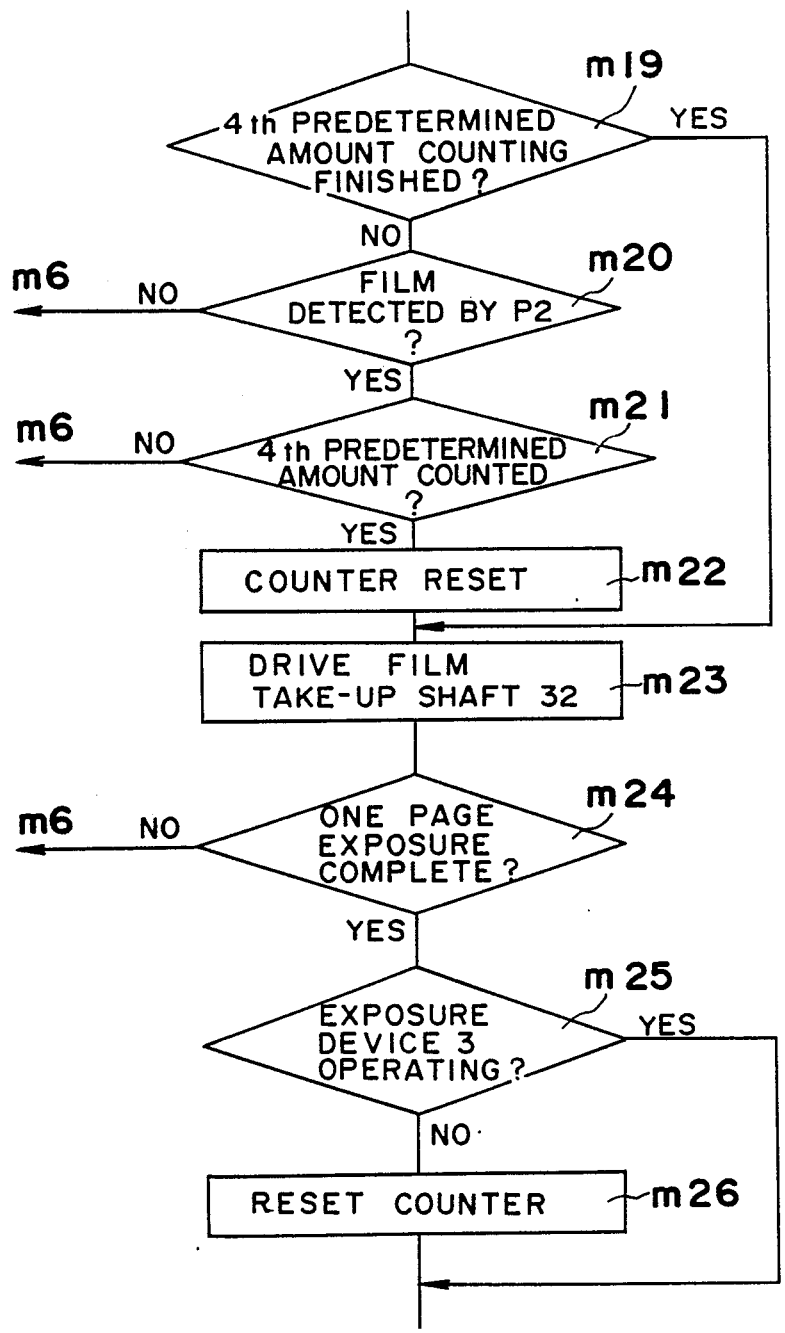
Figure 14D:
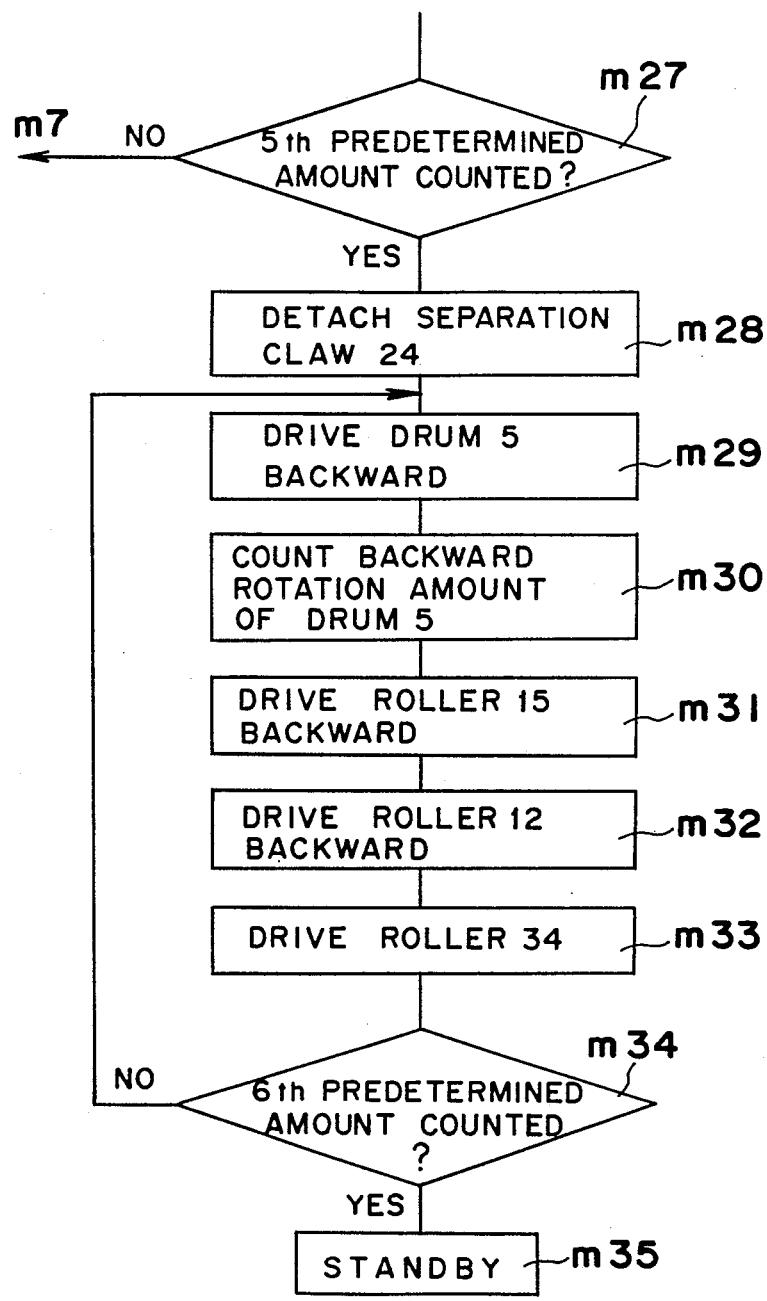

With reference FIG. 14 a flow chart of initial copy processing is shown. In the default mode, leading edge 6a of photosensitive film 6 is positioned at transport roller 19. When the sequence advances from step m1 to step m2, original document 2 is set. At step m3, initial copy processing start key N1 (FIG. 6) provided in switch panel 60 is pressed, and copying starts. At step m4, detector P1 determines whether photosensitive film 6 has been detected, and if photosensitive film 6 has not been detected, an error is displayed at step m5. If photosensitive film 6 is detected at step m4, the copier skips to step m6, and exposure device 3 is driven. Thus, red, blue, and green light is sequentially emitted to original document 2. At step m7 and step m8, transport roller 12 and drum 5 are driven forward, respectively, causing photosensitive film 6 to be carried around the circumference of drum 5 by guide members 16, 17, 18, and transport rollers 19 and 20. When the forward rotation of drum 5 starts at step m9, counting of the amount of forward rotation of drum 5 by counter 67 starts. At step m10, main fixing roller 15 contacts light sensitive drum 5, and ejection roller 28 is driven. At step m12, the value of counter 67 is evaluated to determine if the second predetermined amount has been travelled. This second predetermined amount expresses the distance photosensitive film 6 must travel before supply of copy paper 23 begins. If counting of the second predetermined amount has been completed by step m12, the sequence skips to the following step m14. If at step m12 counting of the second predetermined amount has not been completed, the sequence advances to step m13 to determine if the second predetermined amount has been counted, and if it has not, the sequence returns to step m6. If at step m13 the second predetermined amount has been counted, the sequence advances to step m14, and supply roller 22 is driven. Thus, copy paper 23 is supplied, contacts photosensitive film 6 which is carried along drum 5 at fixing position 8, and passes between drum 5 and main fixing roller 15. As previously described, the predetermined ink particles are compressed and broken by drum 5 and main fixing roller 15, and the predetermined colors are transferred to copy paper 23 and fixed.

Next, at step m15, determined is whether a third predetermined amount has been counted. If it has, the sequence advances to step m18. If the third predetermined amount has not been counted, the sequence advances to step m16, where it is again determined whether a third predetermined amount has been counted. This third predetermined amount expresses the distance the leading edge 6a of photosensitive film 6 must travel to pass separation claw 24. If this third predetermined amount has not been reached by step m16, the sequence returns to step m6. If this third predetermined amount has been reached by step m16, the sequence advances to step m17, the counter is reset, the sequence advances to step m18, and separation claw 24 is switched from the detached position to contact drum 5. Thus, copy paper 23 and photosensitive film 6 passing separation claw 24 are forcibly separated. Thus, separated copy paper 23 passes guide members 25 and 26, and is ejected by ejection rollers 27 and 28 to a tray 29 provided outside the copier.

It is apparent from the foregoing description that, while copy paper 23 is depressed and guided between roller 15 and drum 5, photosensitive film 6 is also taken out from film case 9 and wound on film take-up shaft 32, and during this period no exposure is carried out at the exposure position. Therefore, when one image is transferred on copy paper 23 at transfer station, unused photosensitive film 6 extends between the exposure position and the transfer position. Thus, the unused photosensitive film portion will be rewound back into film case 9, as will be described later in connection with steps m29–m34.

At step m19, whether or not a fourth predetermined amount has been counted is determined. This fourth predetermined amount is the distance leading edge 6a must travel to reach film take-up shaft 32 after leading edge 6a is detected by detector P2. If this fourth predetermined amount has been counted by step m19, the sequence advances to step m23. If the fourth predetermined amount has not been counted, the sequence advances to step m20 where it is determined whether detector P2 has detected photosensitive film 6. Specifically, when photosensitive film 6 passes separation claw 24, and passes between guide members 30 and 31, actuator P2a of detector P2 is tripped. Thus, detector P2 is able to detect photosensitive film 6. If at step m20 detector P2 has detected photosensitive film 6, it is determined at step m21 whether the fourth predetermined amount has been reached. If it has, the sequence advances to step m22, and the counter is reset. When the fourth predetermined amount is counted, leading edge 6a of photosensitive film 6 has been threaded through take-up slot 55 as shown in FIG. 1. If at step m21 the fourth predetermined amount has not been reached, the sequence returns to step m6. At step m23, film take-up shaft 32 is driven, and photosensitive film 6 is wound onto the spindle. At step m24, it is determined whether or not illumination by exposure device 3 of one full page of original document 2 has been completed. If the full page exposure has not been completed, the sequence returns to step m6, and the entire sequence from step m6 is repeated. If the full page illumination has been completed, the sequence advances to step m25. Note that after leading edge 6a of photosensitive film 6 is wound onto film take-up shaft 32, the second, third, and fourth predetermined amounts will have been counted. Therefore, step m12 skips to step m14, step m15 to step m18, and step m19 to step m23.

At step 25, determined is whether exposure device 3 is operating, and if it is not, the sequence skips to step m27. If exposure device 3 is operating, the sequence skips to step m26, and the counter is reset. At step m27, it is determined whether a fifth predetermined amount has been counted. This fifth predetermined amount corresponds to the distance the last exposed portion of photosensitive film 6 must travel to pass main fixing roller 15. If the fifth predetermined amount has not been reached, the sequence returns to step m7.

It is to be noted than when the sequence returns from step m27 to step m7, exposure device 3 stops. Therefore, the sequence after this proceeds from step m7 through step m12, skips to step m14 and advances to step m15, then skips to step m18 and advances to step m19, then skips to step m23 and advances to step m24 and to step m25, and then skips to step m27.

If the fifth predetermined amount has been counted at step m27, the sequence advances to step m28. At step m28, separation claw 24 is switched from contacting drum 5 to being detached. At the next step m29, drum 5 is driven backward, causing counter 67 to begin counting the backward rotation amount of drum 5 at step m30. At step m31 and step m32, main fixing roller 15 and transport roller 12 are driven backward, respectively, and at step m33, photosensitive film rewind roller 34 is driven. Thus, the last exposed part of photosensitive film 6, which is positioned at fixing position 8, is carried backward around drum 5, and film case 9 rotates accordingly. At step m34, determined is whether or not a sixth predetermined amount has been counted, and if it has not, the sequence skips to step m29. If it has been counted, the sequence skips to step m35, and the copier enters the standby mode. This sixth predetermined amount is the amount of backward travel required for the last exposed part of photosensitive film 6 to rewind to approximately the position of transport roller 19. It is to be noted that when the sixth predetermined amount is counted, film case 9 may rotate to the estimated position shown in FIG. 15. This operating sequence from step m1 to step m35 completes the initial process.

Figure 16:
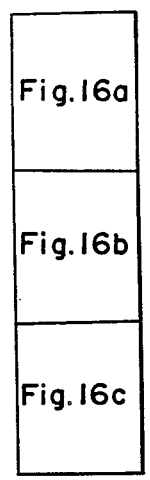
FIGS. 16a–16c is a flow chart showing the copy processing operation.
Figure 16A:
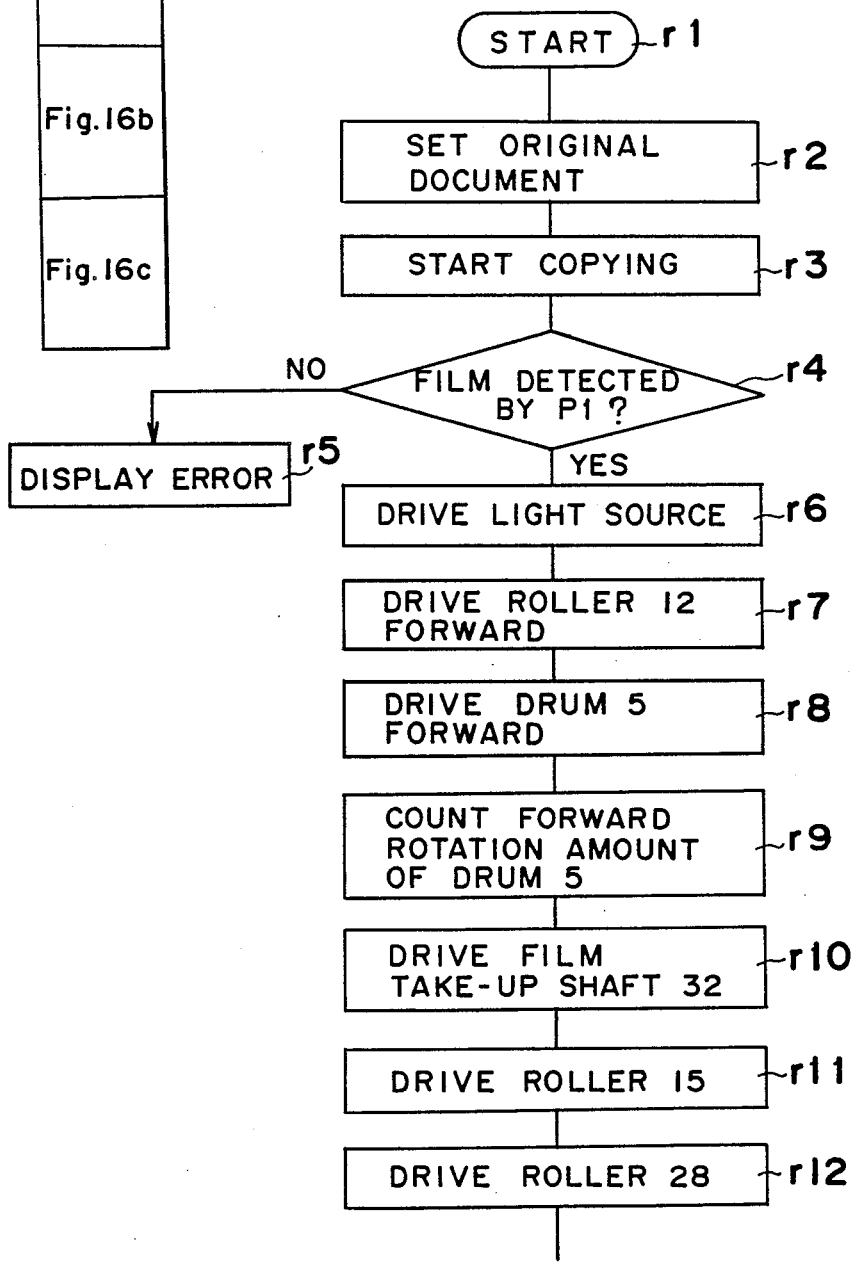
Figure 16B:
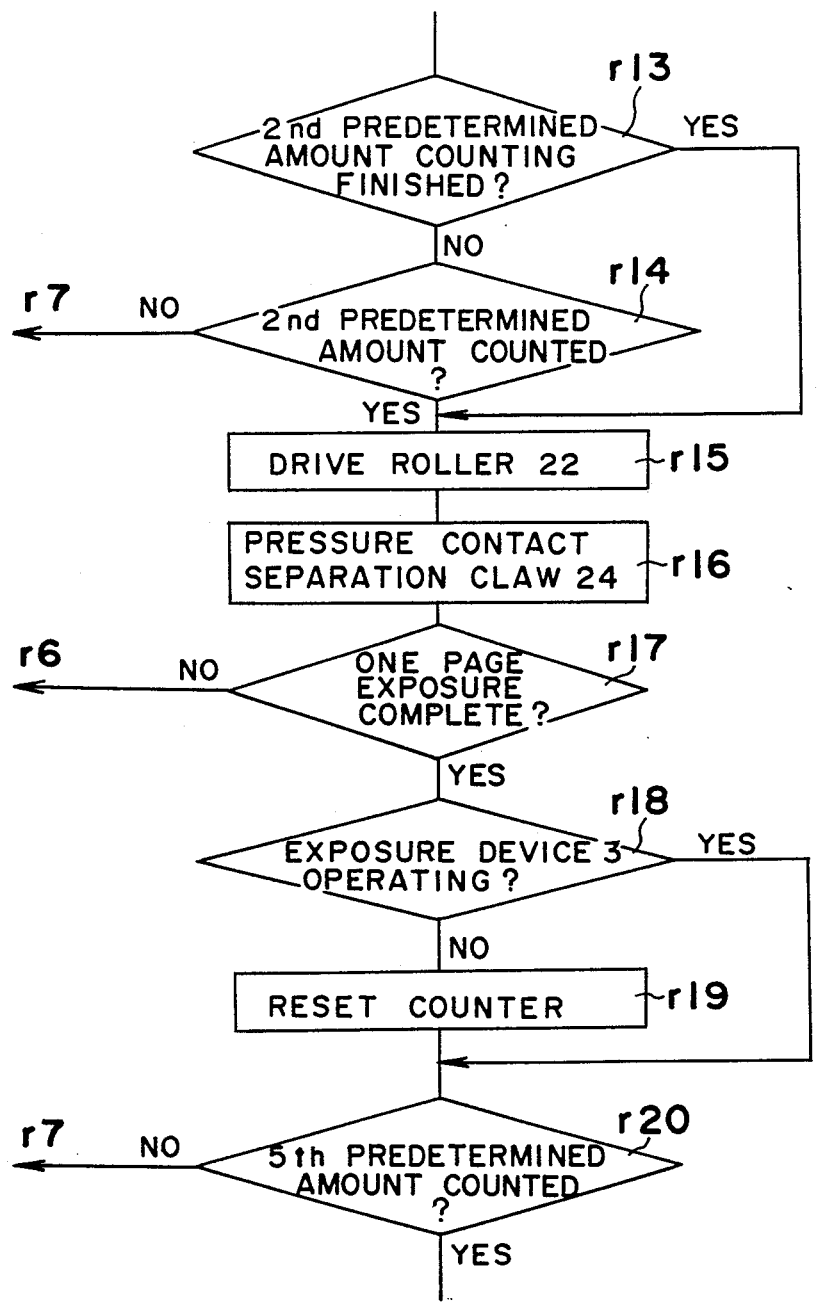
Figure 16C:
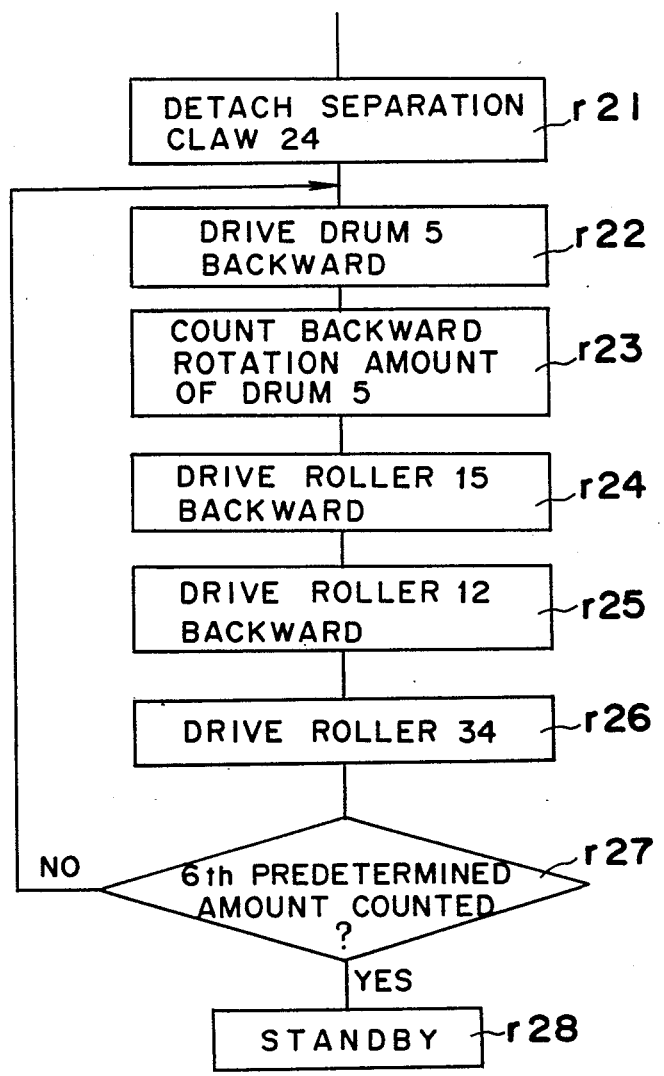

Referring finally 16, a flow chart showing the sequence for the copy processing operation is shown illustrated. After the previously described initial copying process, the copy processing sequence shown in FIG. 16 is performed. Thus, at the start of this copy processing sequence, leading edge 6a of photosensitive film 6 is already wound onto film take-up shaft 32. From this position, the sequence advances from step r1 to step r2, at which point the original document 2 to be copied is set on the copier table. When copy start key N2 (see FIG. 6) provided on switch panel 60 is pressed at the step r3, the sequence advances to step r4, at which step it is determined whether photosensitive film 6 has been detected by detector P1. If the film has not been detected, the sequence advances to step r5, and an error is displayed. If at step r4 detector P1 had detected photosensitive film 6, the sequence skips to step r6 and exposure device 3 is driven. At step r7, transport roller 12 is driven forward, at step r8 drum 5 is driven forward, and thus counting of the amount of forward rotation of drum 5 begins at step r9. Furthermore, at step r10, film take-up shaft 32 is driven. Thus, photosensitive film 6 exposed at exposure position 7 is carried around the circumference of drum 5. At step r11, main fixing roller 15 is driven, and at step r12 ejection roller 28 is driven.

Determined at step r13 is whether counting of the second predetermined amount is finished, and if it is, the sequence skips to step r15. If at step r13 counting of the second predetermined amount is not finished, the sequence advances to step r14, where it is determined if the value of the counter is the same as the second predetermined amount. If it is not, the sequence returns to step r7. If at step r14 the counter value has reached the second predetermined amount, specifically, if drum 5 has travelled the distance required for supply of copy paper 23 to start, the sequence advances to step r15, and supply roller 22 is driven. Thus, copy paper 23 is supplied between drum 5 and main fixing roller 15, where the paper is pressed together with the exposed film by drum 5 and main fixing roller 15, thus causing the appropriate ink particles to be burst, transferred, and fixed on copy paper 23.

Figure 15:
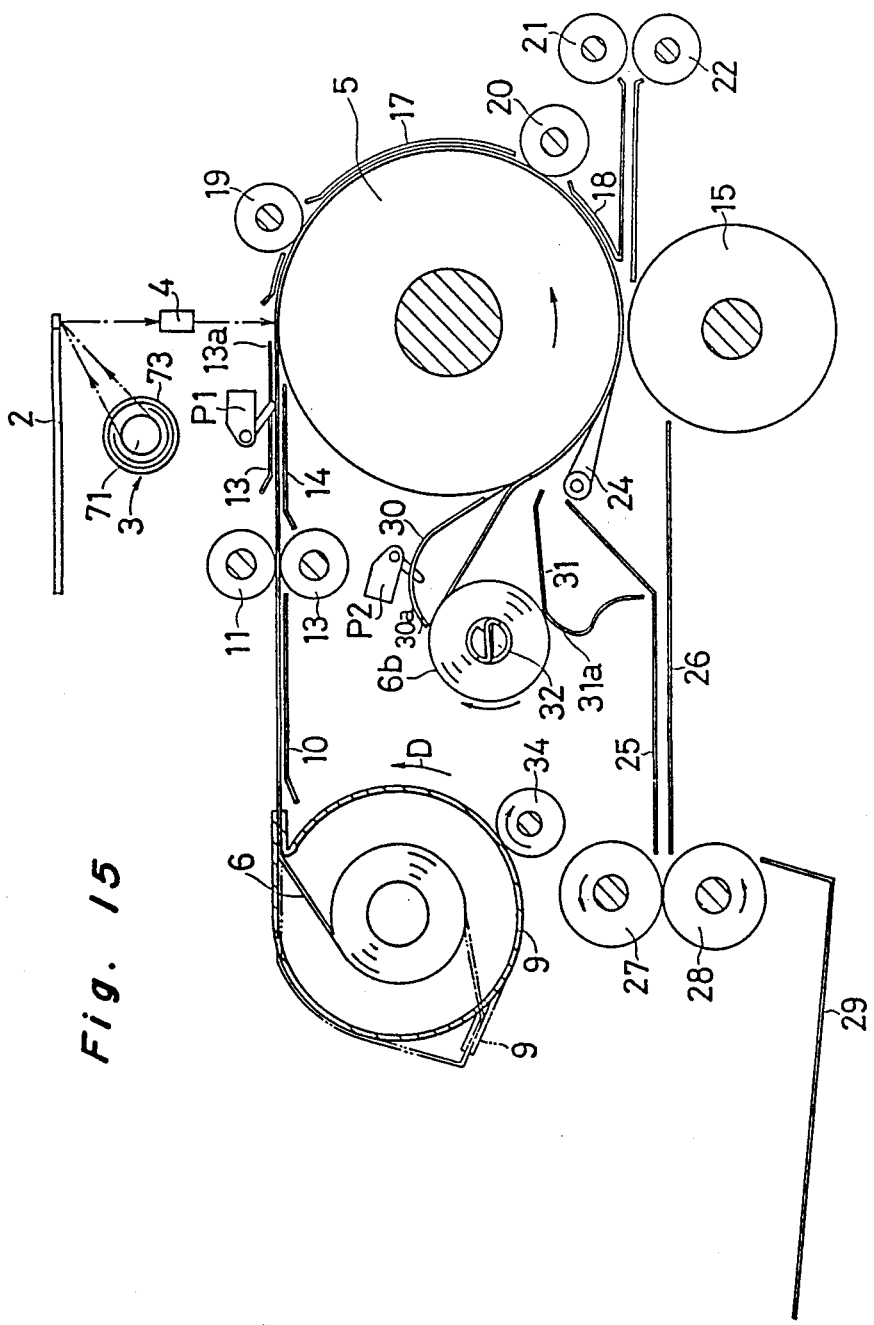
FIG. 15 is a cross sectional view showing the condition in which the photosensitive film is rewound; and FIG. 15

At step r16, separation claw 24 is switched from the detached position to the position at which it presses against drum 5. Thus, copy paper 23 and photosensitive film 6 which were pressed together at fixing position 8 are separated as they pass separation claw 24. The separated copy paper 23 passes guide members 25 and 26, passes ejection rollers 27 and 28, and is ejected to tray 29. After it has passed separation claw 24, photosensitive film 6 is wound onto film take-up shaft 32. As shown in FIG. 15, pressure is applied by ends 30a and 31a of guide members 30 and 31 to surface 6b of photosensitive film 6 as it is wound onto film take-up shaft 32. Thus, photosensitive film 6 is wound onto film take-up shaft 32 evenly.

At the following step r17, it is determined whether exposure of one full original page is completed, and if it is not, the sequence returns to step r6. If exposure of one full page is completed, the sequence advances from step r17 to step r18. Thus, a determination is made to see if exposure device 3 is operating, and if it is not, the sequence skips to step r20. If exposure device 3 is operating at step r18, the counter is reset at step r19. At step r20, it is determined whether or not the value of counter 67 has reached the fifth predetermined amount, and if it has not, the sequence returns to step r7. In this case, exposure device 3 stops. If at step r20 the fifth predetermined amount has been counted, the final exposed part of photosensitive film 6 has passed main fixing roller 15, transfer of the final exposed portion is completed, and the image is fixed. When transfer of a full page from original document 2 to copy paper 23 is completed, the sequence advances to step r21, and separation claw 24 is detached from drum 5. Note that copy paper 23 has already passed guide members 25 and 26 before separation claw 24 is detached from drum 5. Steps r22, r23, r24, r25, and r26 are now completed in sequence. Thus, main fixing roller 15 of drum 5 and transport roller 12 are driven backward, and photosensitive film rewind roller 34 is driven. Counter 67 thus begins to count the amount of backward rotation of drum 5 when drum 5 is driven backward. Thus, photosensitive film 6 is rewound, and when the sixth predetermined amount, which is the distance the final exposed part of photosensitive film 6 must travel to be approximately positioned at transport roller 19, is counted, the sequence advances from step r7 to step r8. Thus, the copier enters the standby mode.

When the copy operation for a second original document 2 is performed immediately after the last exposed part of photosensitive film 6 has passed the fixing position without rewinding photosensitive film 6, the part of photosensitive film 6 positioned between exposure position 7 and fixing position 8 is not used, resulting in uneconomical operation. However, as occurs in a color copier according to the present invention, rewinding of photosensitive film 6 enables more efficient use of the entire photosensitive film.

Note that when ejection rollers 27 and 28 are used as heat fusing rollers, the surface of copy paper 23 is heat-fused as the paper passes through ejection rollers 27 and 28, imparting a gloss and improved color to the copied image.

According to the first preferred embodiment of the present invention as described above, separate red, blue, and green light sources are not required, a charge-coupled device image sensor or other light receptor is not required. Therefore, the copier construction can be simplified and the copying speed can be increased.

Furthermore, because the photosensitive film is enclosed in a lightproof film case, exposure by ambient light or light sources other than the exposure device is prevented. Thus, copying of sharper color images is possible.

Furthermore, insertion of the photosensitive film between the transport rollers is easier because the rollers are detached and the guide members are covering the transportation path when the photosensitive film is first loaded. Furthermore, because the leading edge of the photosensitive film contacts the guide member and is prevented from being inserted any farther, the leading edge of the film can be loaded to the same position with each loading operation. Thus, detecting the position of the leading edge of the film can be accomplished with high precision.

Furthermore, according to the first embodiment of the present invention, because the take-up shaft is designed in a manner so as to begin driving after a predetermined time interval after the detection of the leading edge of the photosensitive film by the detection means, the leading edge of the photosensitive film is inserted into a hole in the take-up shaft when this predetermined time has elapsed and the take-up shaft is driven after the leading edge is thus threaded. Therefore, a film threading operation in which the photosensitive film is transported and wound automatically onto the take-up shaft can be automatically performed.

Furthermore, according to the present invention, because the guide members contact the roll of photosensitive film wound onto the take-up shaft in a pressure applied manner, the desired contact pressure acts on the aforementioned roll of photosensitive film. Thus, the photosensitive film is wound evenly onto the take-up shaft.

Furthermore, according to the present invention, because a means for driving the film case backwards is provided, the film case can be driven backwards when the last exposed portion of the photosensitive film reaches the fixing position so that the unused portion of the photosensitive film is rewound from the fixing position to the exposure position when copying is to be performed again. Thus, unused portions of the photosensitive film can be eliminated, and the photosensitive film can be effectively used.

Furthermore, according to the color copying device of the present invention, since ejection rollers are constructed in a such a manner as to function also as heat fusing rollers, and whether such ejection rollers are used as ejection rollers or heat fusing rollers can be selected, a glossy finish can be imparted to copied images without providing separate heat fusing rollers. Thus, the copier can be constructed compactly and at a lower cost.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims unless they depart therefrom.

What is claimed is:

1. A color image copying device comprising:
   exposure means for exposing an original document with red, blue, and green light;
   a photosensitive film having a substrate and an ink coating which includes ink particles of multiple colors carried on said substrate, and on which a reproduction of the original document is formed, in response to the light exposure, through a reaction of ink particles of the color which corresponds to the wavelength of the light reflected from the original document;
   film case means for storing said photosensitive film, said film case means being made of a lightproof material;
   image forming means for forming an image of said original document on said photosensitive film by focusing the reflected light;
   copy paper feeding means for feeding a copy paper;
   fixing means for fixing the image formed on said photosensitive film on said copy paper;
   separation means which separates said photosensitive film from said copy paper after the fixing of said image;
   a film take-up shaft for winding thereon said photosensitive film, said film take-up shaft being located downstream from said separation means in the direction of paper transport, and being formed with an insertion slot for inserting a leading edge of said photosensitive film;
   take-up shaft driving means for driving said take-up shaft to take-up said film after insertion in said slot of the leading edge of said film;
   detection means for detecting the leading edge of the photosensitive film at a position between said separation means and said take-up shaft; and
   control means for controlling said take-up shaft drive means to rotate after a predetermined time which is sufficient for the leading edge of the film being inserted in said insertion slot after said film detection means detects said leading edge of the film.

2. A color image copying device comprising:
   exposure means for exposing an original document with red, blue, and green light;
   a photosensitive film having a substrate and an ink coating which includes ink particles of multiple colors carried on said substrate, and on which a reproduction of the original document is formed, in response to the light exposure, through a reaction of ink particles of the color which corresponds to the wavelength of the light reflected from the original document;
   film case means for storing said photosensitive film, said film case means being made of a lightproof material;
   image forming means for forming an image of said original document on said photosensitive film by focusing the reflected light;
   copy paper feeding means for feeding a copy paper;
   fixing means for fixing the image formed on said photosensitive film on said copy paper;
   separation means which separates said photosensitive film from said copy paper after the fixing of said image;
   a film take-up shaft for winding thereon said photosensitive film; and a pair of guide members which conduct the photosensitive film separated from the copy paper by the separation means into said take-up shaft, said guide members contacting in a pressure applied manner the outer surface of the photosensitive film being wound onto the take-up shaft, and which are mutually juxtaposed and displaced in accordance with changes in the diameter of said take-up roll.

3. A color image copying device comprising:

exposure means for exposing an original document with red, blue, and green light;

a photosensitive film having a substrate and an ink coating which includes ink particles of multiple colors carried on said substrate, and on which a reproduction of the original document is formed, in response to the light exposure, through a reaction of ink particles of the color which corresponds to the wavelength of the light reflected from the original document;

a film case means for storing said photosensitive film, said film case means being made of a lightproof material;

image forming means for forming an image of said original document on said photosensitive film by focusing the reflected light;

copy paper feeding means for feeding a copy paper;

fixing means for fixing the image formed on said photosensitive film on said copy paper;

separation means which separates said photosensitive film from said copy paper after the fixing of said image; and means for driving said film case backwards.

4. A color image copying device comprising:

exposure means for exposing an original document with red, blue, and green light;

a photosensitive film having a substrate and an ink coating which includes ink particles of multiple colors carried on said substrate, and on which a reproduction of the original document is formed, in response to the light exposure, through a reaction of ink particles of the color which corresponds to the wavelength of the light reflected from the original document;

film case means for storing said photosensitive film, said film case means being made of a lightproof material;

image forming means for forming an image of said original document on said photosensitive film by focusing the reflected light;

copy paper feeding means for feeding a copy paper;

fixing means for fixing the image formed on said photosensitive film on said copy paper;

separation means which separates said photosensitive film from said copy paper after the fixing of said image; and ejection rollers which eject the separated copy paper separated from the photosensitive film by said separation means, and which may also act as heat fusing rollers by means of heating elements built in to said ejection rollers.

* * * * *